(12) United States Patent
Mai et al.

(10) Patent No.: US 8,824,128 B2
(45) Date of Patent: Sep. 2, 2014

(54) FLEXIBLE CIRCUIT BOARD SHIELDING DEVICE FOR ELECTRONIC APPARATUS

(75) Inventors: Chien Cheng Mai, New Taipei (TW); Kuo Cheng Liao, New Taipei (TW)

(73) Assignee: First Dome Corporation, New Taipei (TW)

( * ) Notice: Subject to any disclaimer, the term of this patent is extended or adjusted under 35 U.S.C. 154(b) by 185 days.

(21) Appl. No.: 13/437,137

(22) Filed: Apr. 2, 2012

(65) Prior Publication Data
US 2013/0255995 A1 Oct. 3, 2013

(51) Int. Cl.
*G06F 1/16* (2006.01)

(52) U.S. Cl.
USPC ............... 361/679.27; 349/153; 362/249.02; 439/668

(58) Field of Classification Search
USPC ............ 349/58, 139, 153, 62, 8; 361/679.36, 361/679.37, 679.01, 679.26, 679.03, 679.3, 361/679.21, 679.04, 679.48, 679.27, 361/679.02, 679.08, 679.05, 679.34, 361/679.28, 679.41, 679.56, 679.09, 361/679.16; 343/702, 700 MS, 767, 712, 343/853; 362/702, 602, 609, 124, 97.1, 362/632, 249.02, 555, 341, 633; 439/495, 439/492, 260, 607.01, 497, 174, 668, 493, 439/196

See application file for complete search history.

(56) References Cited

U.S. PATENT DOCUMENTS

| | | | |
|---|---|---|---|
| 2009/0091884 A1* | 4/2009 | Walker et al. | ............ 361/679.37 |
| 2013/0083558 A1* | 4/2013 | Becze | ............................ 362/611 |
| 2013/0162485 A1* | 6/2013 | Hobson et al. | ................ 343/702 |

* cited by examiner

*Primary Examiner* — Hung Duong
(74) *Attorney, Agent, or Firm* — Rosenberg, Klein & Lee

(57) ABSTRACT

A flexible circuit board shielding device for an electronic apparatus is disclosed. The flexible circuit board shielding device is provided to protect a flexible circuit board or a cable, including a body assembled on a slide and/or rotation module and a wing portion pivoted to the body. When the body is moved in response to the motion of the slide and/or rotation module, the wing portions can be freely swung or rotated in response to on the body.

24 Claims, 5 Drawing Sheets

FLEXIBLE CIRCUIT BOARD SHIELDING DEVICE FOR ELECTRONIC APPARATUS

BACKGROUND OF THE INVENTION

1. Field of the Invention

The present invention relates to a flexible circuit board shielding device for an electronic apparatus, in particular relates to a shielding device assembled to a slide and/or rotation machine body and capable of being moved and swung to protectively shield a flexible circuit board or a cable in the operation and engagement processes.

2. Description of the Related Art

Conventionally, electronic devices such as mobile phones, portable computers, personal digital assistants (PDAs), digital cameras and e-books, etc., are provided with a slide cover and/or a rotary shaft system which are/is capable of being reciprocally moved or rotated by an external force, so that a slide cover module (e.g., monitor) of the electronic device can be slid or rotated to perform an opening and closing process.

These slide cover modules or portions are often applied with an assembly of a slide component or module and a rotation component provided with a rotatable ring, generally incorporated with elastic ring, elastic fastener or spring for storing energy or providing released energy, to assist in moving the slide cover module (or a slide module) to perform the opening, closing and rotation functions.

One topic related to operations, motions and structural designs of the above-described cases is that a flexible circuit board or a cable is disposed between a slide module and a host machine or a fixed machine body (e.g., a keyboard base) for signal communication therebetween. As known by those who skilled in this art, the flexible circuit board or the cable is exposed to the outside when the slide module (or the monitor) is rotatably opened or operably overturned. It is not only to influence an artistic outlook of the electronic device (or the computer), but also to cause damages to the flexible circuit board or the cable such as external factors or human accidental collision, pulling and dragging (which are not our expectations).

Representatively speaking, the disclosures of the above-mentioned reference data reveal the conditions of usage and structural design of the slide and/or rotation module or components connected therewith. If the structures and above-described applications of the slide and/or rotation module, the flexible circuit board or the cable, and the components connected therewith can be properly redesigned and reconsidered, the use pattern and the range of application of the monitor system can be advancedly altered and increased, thus to be distinguished from conventional methods. For example, a protection device or mechanism can have a motion which is in response to a motion of a slide and/or rotation module, thus to protectively shield the flexible circuit board or the cable for protection, to improve the conditions of the flexible circuit board or the cable exposed to the outside, to increase artistic outlook of the electronic device, and possibly reduce damages to the flexible circuit board or the cable due to external factors and human factors. However, the above-described topics do not physically taught or implied in the cited reference data.

BRIEF SUMMARY OF THE INVENTION

In view of this, the purpose of the present invention is to provide a flexible circuit board shielding device for an electronic apparatus. The flexible circuit board shielding device is provided to protect a flexible circuit board or a cable, including a body assembled on a slide and/or rotation module and a wing portion pivoted to the body. When the body is moved in response to the motion of the slide and/or rotation module, the wing portions can be freely swung or rotated in response to on the body.

According to the flexible circuit board shielding device for the electronic apparatus of the present invention, the body includes a pivot portion which is pivoted to the slide and/or rotation module and a free end which is assembled and freely moved and rotated in a rail. Thus, the body can protectively shield a flexible circuit board or a cable when the body is moved in response to a motion of the slide and/or rotation module.

According to the flexible circuit board shielding device for the electronic apparatus of the present invention, the wing portion includes at least one limiting end utilized to define a swinging or rotating range thereof. Concretely speaking, when the body is moved in response to the motion of the slide and/or rotation module, the wing portions are downwardly swung or rotated by weights themselves so as to assist the body in shielding the side regions of the flexible circuit board or the cable, and then the wing portions are forced to stop swinging or rotating until the limiting ends of the wing portions are pressed against the body A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
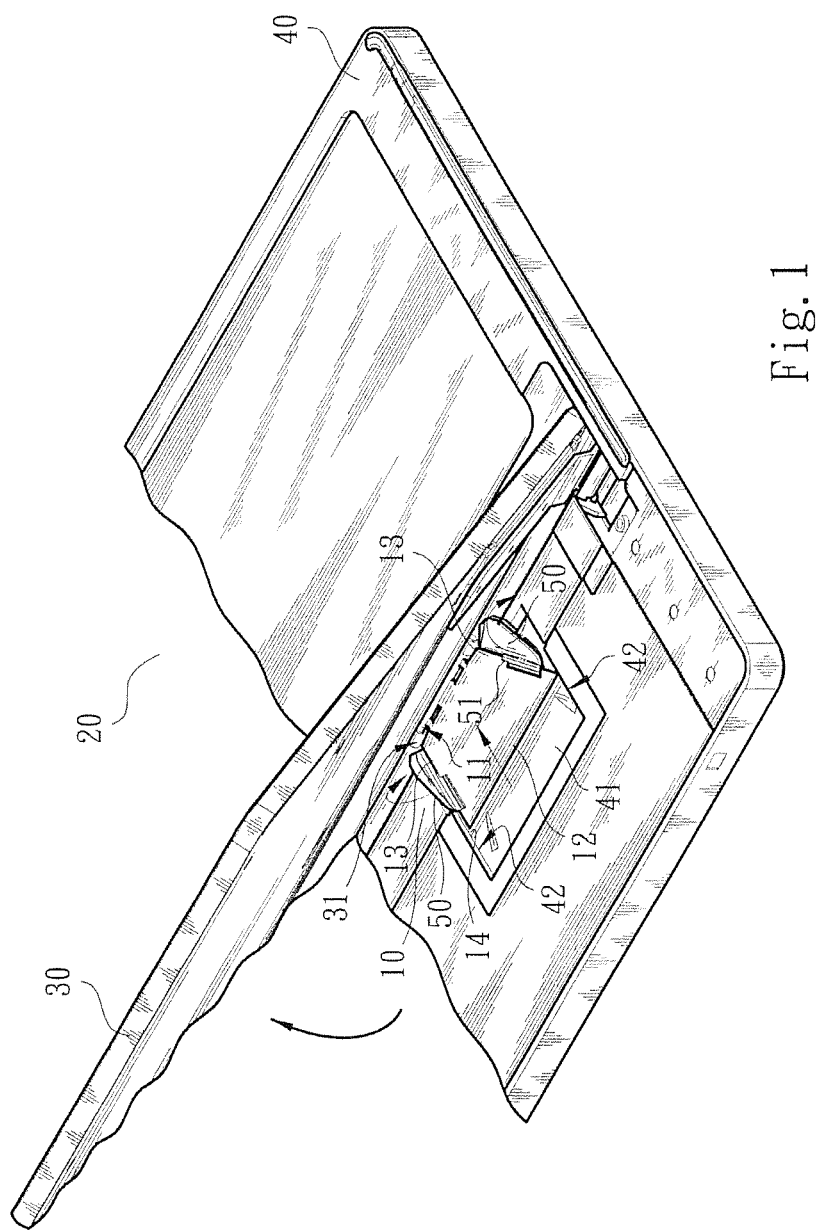
FIG. 1 is an outlook schematic view of an embodiment of the present invention assembled with an electronic apparatus, illustrating a condition of rotation of a slide and/or rotation module and combination motion of a body and a wing portion.
Figure 2:
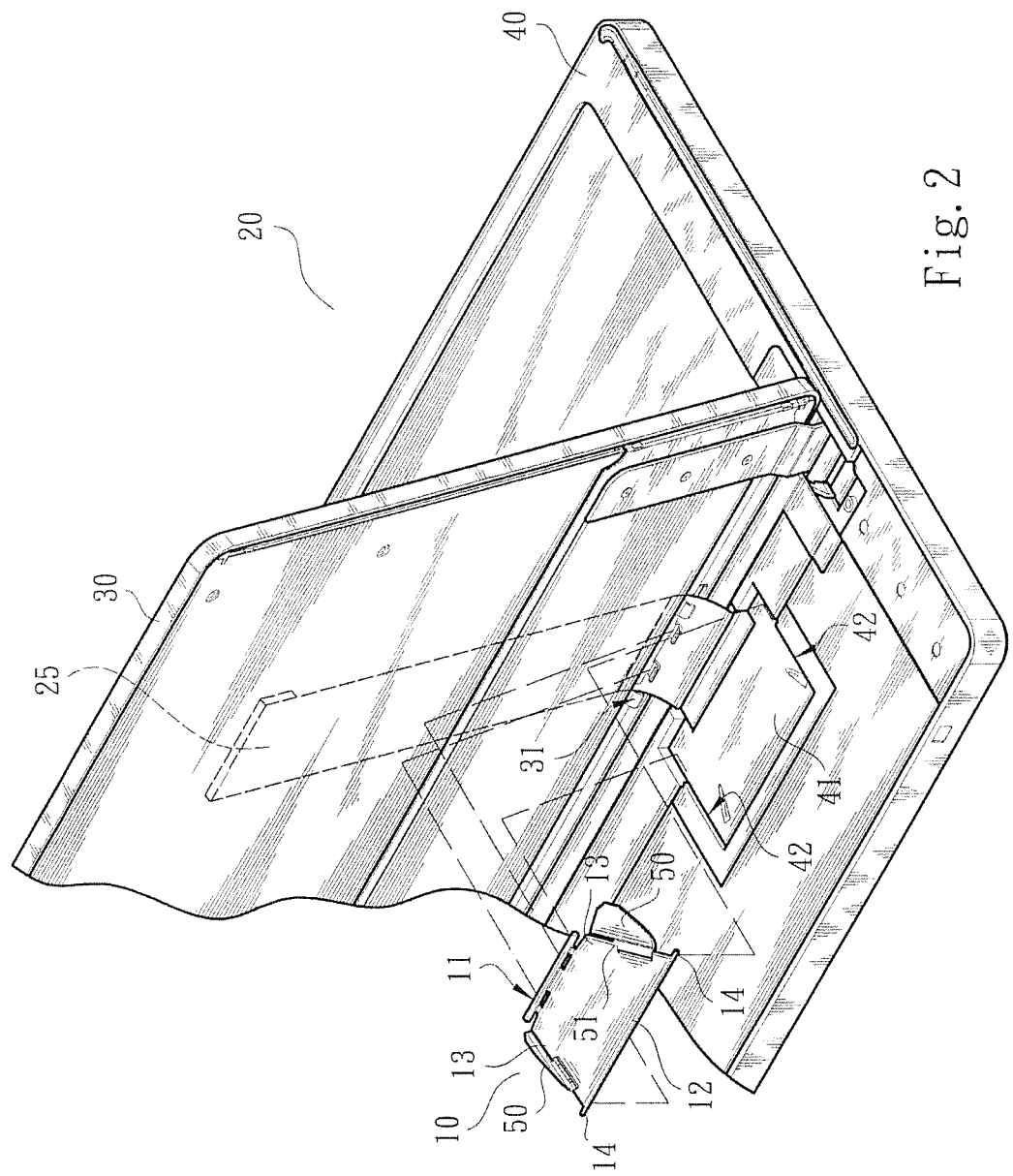
FIG. 2 is a structural schematic view of an embodiment of the present invention assembled with an electronic apparatus, illustrating structure and arrangement relationship of a body and a wing portion.

Referring to FIGS. 1 and 2, a flexible circuit board shielding device of the present invention includes a body which could be a plate formed of a geometry profile and is generally denoted by reference numeral 10. In an adopted embodiment, the body 10 is selectively formed of a plate type with trapezoid profile which is defined with a narrow side and a wide side. The body 10 assembled to a slide and/or rotation module 30 (e.g., a slide cover or monitor) of an electronic apparatus 20 is moved in response to a motion of a slide and/or rotation module 30. Concretely speaking, the electronic apparatus 20 is selected from a portable computer in this embodiment. The electronic apparatus 20 includes a host machine or a fixed machine body 40 (e.g., a keyboard base), in which a flexible circuit board or a cable 25 is disposed between the slide and/or rotation module 30 and the fixed machine body 40 for signal communication therebetween.

FIGS. 1 and 2 illustrate that the body 10 comprises a pivot portion 11 formed at the narrow side thereof, a free end 12 formed at the wide side, and two side edges 13, in which the pivot portion 11 pivotally assembled on a rotary shaft portion 31 of the slide and/or rotation module 30 so that the body 10 is formed by type of being freely rotated, and the free end 12 is assembled on the fixed machine body 40 so that the free end 12 is formed by type of being freely rotated.

Specifically speaking, the fixed machine body 40 is defined with a recessed compartment 41 utilized to receive the body 10 and a rail 42 formed on the recessed compartment 41. In this embodiment, the rail 42 is formed on both sides of the recessed compartment 41 of the fixed machine body 40. The body 10 further comprises at least one peg 14 which is formed on the free end 12 and corresponding to the rail 42 of the fixed machine body 40. The peg 14 of the body 10 is movably and rotatably assembled in the rail 42 of the fixed machine body 40, so that the body 10 can be utilized to protectively shield the flexible circuit board or the cable 25 when the body 10 is moved in response to or complying the motion of the slide and/or rotation module 30 (the related contents will be described in detail hereinafter).

Figure 3:
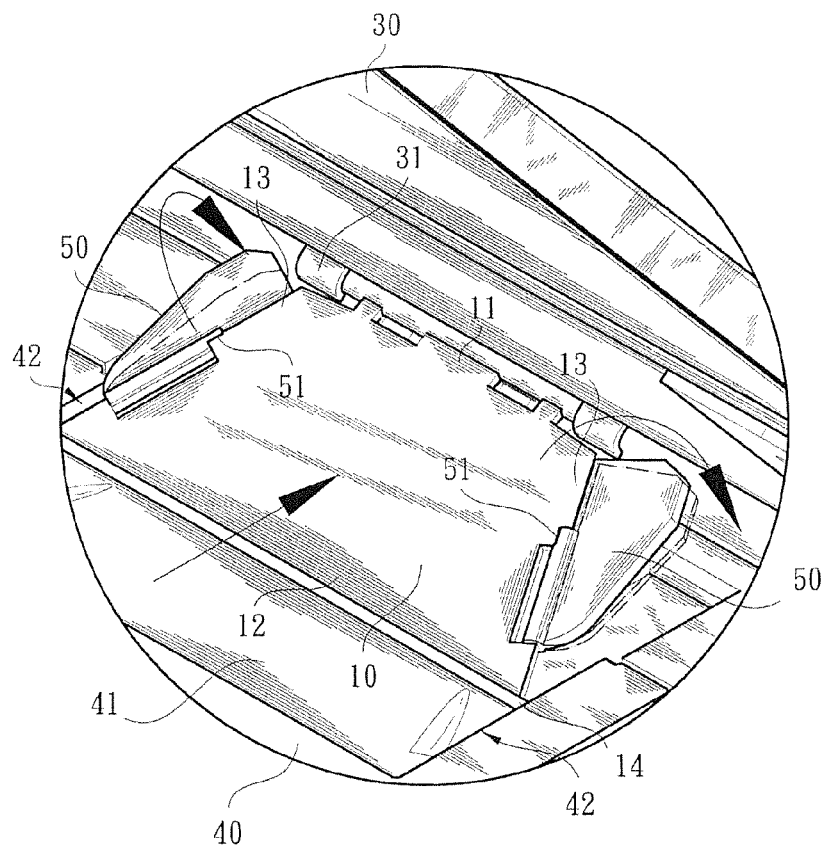
FIG. 3 is an enlarged structural schematic view of a body and a wing portion of the present invention, in which a motion condition of a wing portion is illustrated by an imaginary line.
Figure 4:
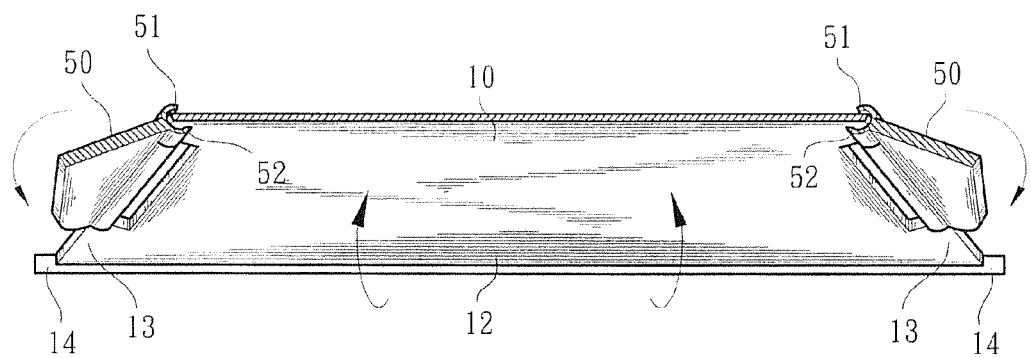
FIG. 4 is a sectional schematic view of a body and a wing portion of the present invention, in which a condition of a movement direction of the body and the wing portion is illustrated by arrows.

In a preferred embodiment, the body 10 or each of the two side edges 13 of the body 10 is swingly pivoted with a wing portion 50, so that the wing portions 50 can be freely swung or rotated. The body 10 and the wing portions 50 are assembled into an integral structure having a shape formed by type of rectangular profile. Referring to FIGS. 3 and 4, the wing portion 50 comprises a first limiting end 51 and a second limiting end 52, in which the first limiting end 51 and the second limiting end 52 are utilized to define a swinging or rotating range of the wing portion 50.

Concretely speaking, when the body 10 is moved in response to the motion of the slide and/or rotation module 30, each of the wing portions 50 can be swung by weight itself so as to assist the body 10 in shielding side regions of the flexible circuit board or the cable 25, and then the wing portions 50 are forced to stop swinging or rotating until the second limiting ends 52 of the wing portions 50 are pressed against the body 10, thus to prevent excessive swinging of the wing portions 50 extended toward the bottom side of the drawing of FIGS. 3 and 4. Therefore, with the first limiting end 51 of the wing portion 50, the wing portion 50 can be prevented from excessive swinging toward the top side of the drawing of FIGS. 3 and 4.

Figure 5:
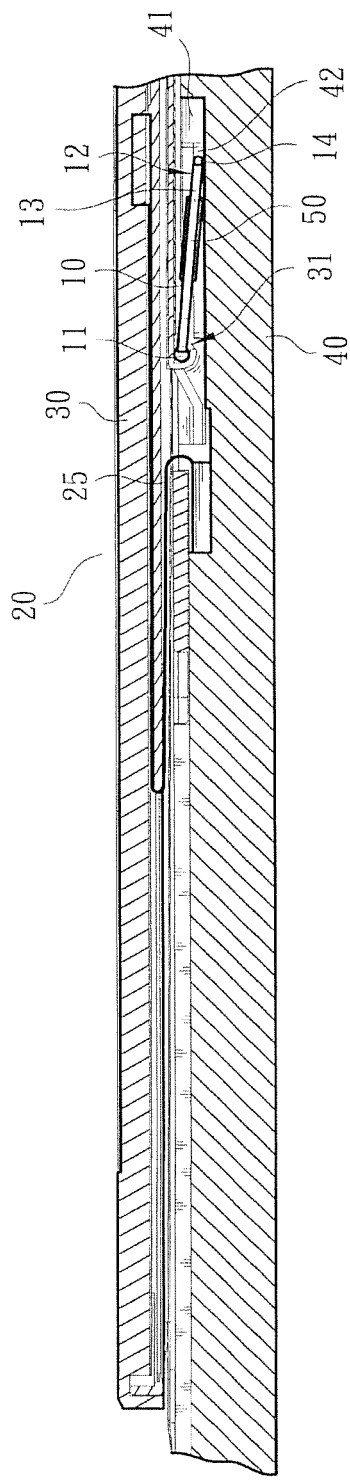
FIG. 5 is a schematic view of a slide and/or rotation module covered on a fixed machine body in an embodiment of the present invention, in which a condition of a body and a wing portion which are received in a recessed compartment is illustrated.

Referring to FIG. 5, it can be seen that the slide and/or rotation module 30 is covered on the fixed machine body 40, the flexible circuit board or the cable 25 of being allowably formed by a folded type is received in between the slide and/or rotation module 30 and the fixed machine body 40, and the body 10 and the wing portions 50 are received in the recessed compartment 41 of the fixed machine body 40. When the slide and/or rotation module 30 is operated to move to a condition as illustrated in FIG. 6, the body 10 and the wing portions 50 are still received in the recessed compartment 41 of the fixed machine body 40.

Figure 7:
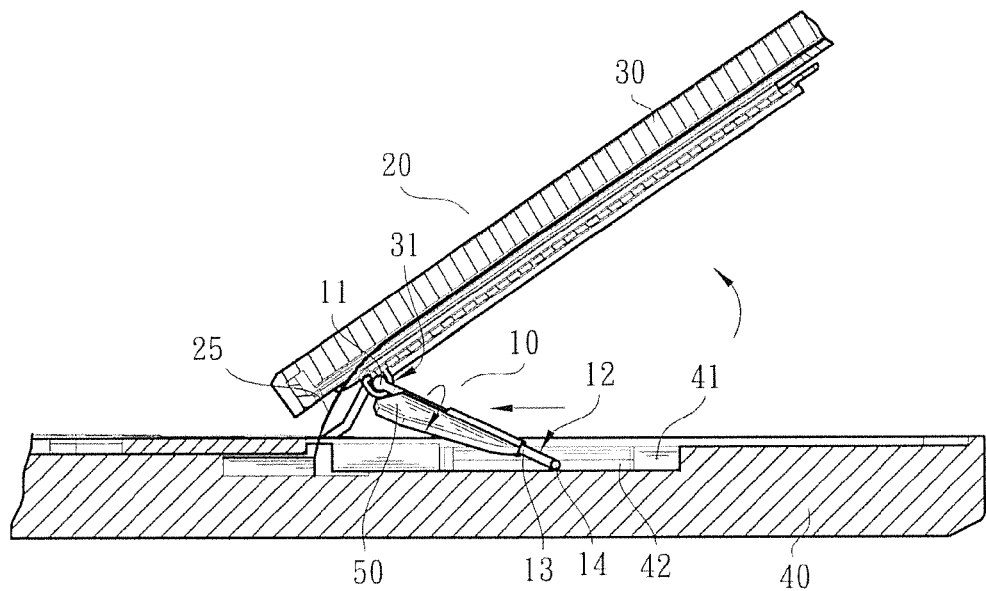
FIG. 7 is a schematic view of a slide and/or rotation module to be freely rotated in an embodiment of the present invention, in which a motion condition of a body and a wing portion is illustrated.
Figure 8:
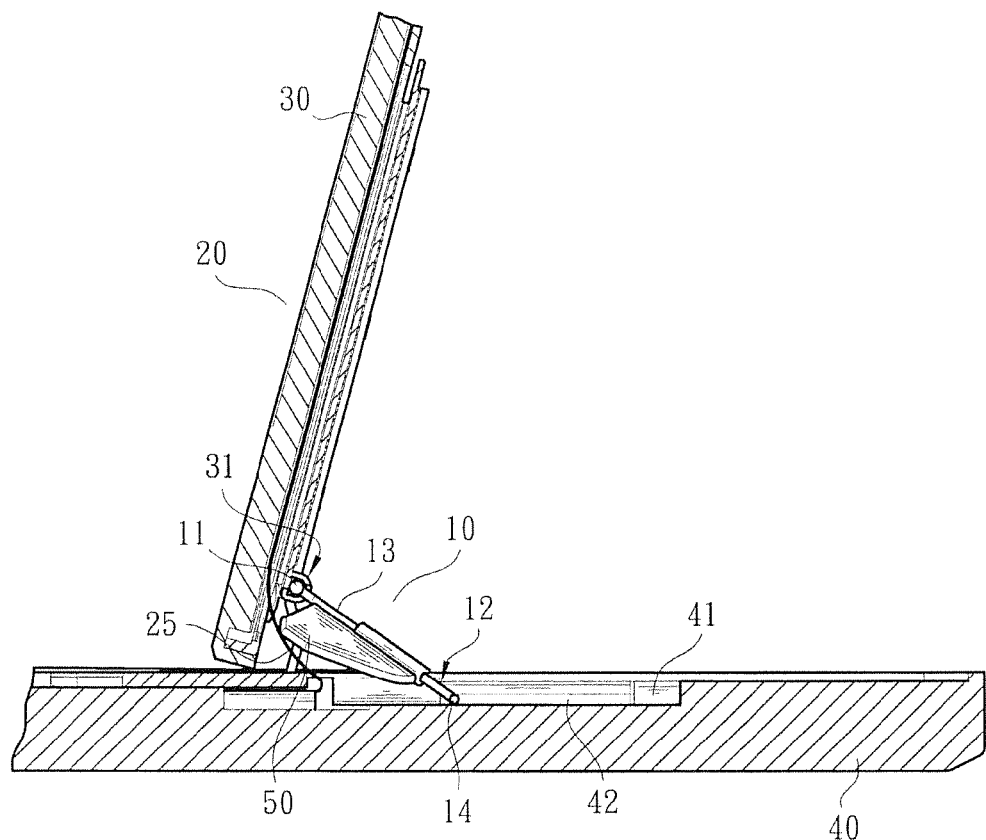
FIG. 8 is a schematic view of a slide and/or rotation module to be freely rotated in another embodiment of the present invention, in which a motion condition of a body and a wing portion is illustrated.

Referring to FIGS. 7 and 8, when the slide and/or rotation module 30 is rotated to move to a setting position by taking the rotary shaft portion 31 as a fulcrum, the slide and/or rotation module 30 can be provided for user operation and viewing. In FIG. 7, when the slide and/or rotation module 30 is rotated about the rotary shaft portion 31 in the direction of an arrow, the pivot portion 11 of the body 10 is lifted in response to the rotating motion of the slide and/or rotation module 30, and the free end 12 of the body 10 is moved in the rail 42 of the fixed machine body 40 (i.e., toward the left side of the drawing of FIGS. 7 and 8) in response to the lifting motion of the pivot portion 11 of the body 10, thus to enable the body 10 to shield the flexible circuit board or the cable 25. Furthermore, with the lifting motion of the pivot portion 11 of the body 10, the wing portions 50 are downwardly swung (i.e., toward the bottom side of the drawing of FIGS. 7 and 8) by weights themselves so as to shield the side regions of the flexible circuit board or the cable 25, as shown in FIG. 8.

Figure 6:
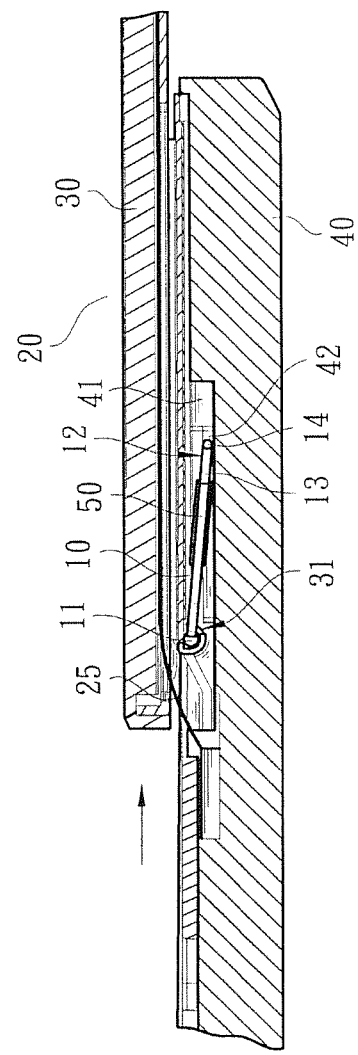
FIG. 6 is a schematic view of a slide and/or rotation module to be movably operated in an embodiment of the present invention.

It shall be additionally explained that the body 10 and the wing portions 50 can be automatically received in the recessed compartment 41 of the fixed machine body 40, when the slide and/or rotation module 30 is attached to the fixed machine body 40 after the rotating motion (e.g., the condition in FIG. 6).

It is understood that the body 10 and the wing portions 50 are moved in response to the motion of the slide and/or rotation module 30, thus to regularly shield the flexible circuit board or the cable 25 for protection. The imperfect condition of the flexible circuit board or the cable exposed to the outside in conventional skills can be improved and acted accordingly.

Representatively speaking, under the term of the movement of the flexible circuit board shielding device in response to the operation motion of the slide and/or rotation module 30, the present invention provides the following considerations and advantages, compared to conventional skills. Firstly, due to the assembled structure type of the first and second limiting ends 51 and 52 of the wing portions 50 cooperating with and the pivot portion 11 and the free end 12 of the body 10, the body 10 and the wing portions 50 can have lifting, rotating and translating motions in response to the motion of the slide and/or rotation module 30, so that the flexible circuit board or the cable 25 can be regularly shielded for protection. It is not only to improve the imperfect condition of the flexible circuit board or the cable exposed to the outside in conventional skills, but also an artistic outlook of the electronic device can be obtained. Furthermore, the damages to the flexible circuit board or the cable 25 such as external factors or human accidental collision, pulling and dragging can be possibly reduced.

In conclusion, the flexible circuit board shielding device for the electronic apparatus of the present invention effectively provides a unique spatial pattern different from conventional skills and incomparable advantages and inventiveness.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A flexible circuit board shielding device for an electronic apparatus, comprising:

a body moved in response to a motion of a slide and/or rotation module, comprising a pivot portion pivoted to the slide and/or rotation module, a free end assembled on a fixed machine body, and a side edge;

wherein the fixed machine body is defined with a recessed compartment utilized to receive the body and a rail formed on the recessed compartment.

2. The flexible circuit board shielding device for the electronic apparatus as claimed in claim 1, wherein the body is pivoted with a wing portion.

3. The flexible circuit board shielding device for the electronic apparatus as claimed in claim 2, wherein the wing portion is swingly pivoted to the side edge of the body.

4. The flexible circuit board shielding device for the electronic apparatus as claimed in claim 3, wherein the wing portion and the body are assembled into an integral shape formed by type of a rectangular profile.

5. The flexible circuit board shielding device for the electronic apparatus as claimed in claim 3, wherein the wing portion comprises a first limiting end and a second limiting end.

6. The flexible circuit board shielding device for the electronic apparatus as claimed in claim 3, wherein the fixed machine body is defined with a recessed compartment utilized to receive the wing portion.

7. The flexible circuit board shielding device for the electronic apparatus as claimed in claim 3, wherein the wing portion is swung by weight itself.

8. The flexible circuit board shielding device for the electronic apparatus as claimed in claim 2, wherein the body is a plate that is defined with a narrow side and a wide side.

9. The flexible circuit board shielding device for the electronic apparatus as claimed in claim 8, wherein in the body the pivot portion is formed on the narrow side and the free end is formed on the wide side.

10. The flexible circuit board shielding device for the electronic apparatus as claimed in claim 2, wherein the slide and/or rotation module comprises a rotary shaft portion, and the pivot portion of the body is assembled to the rotary shaft portion of the slide and/or rotation module, so that the body is formed by type of being freely rotated.

11. The flexible circuit board shielding device for the electronic apparatus as claimed in claim 2, wherein the wing portion and the body are assembled into an integral shape formed by type of a rectangular profile.

12. The flexible circuit board shielding device for the electronic apparatus as claimed in claim 2, wherein the fixed machine body is defined with a recessed compartment utilized to receive the wing portion.

13. The flexible circuit board shielding device for the electronic apparatus as claimed in claim 2, wherein the wing portion comprises a first limiting end and a second limiting end.

14. The flexible circuit board shielding device for the electronic apparatus as claimed in claim 2, wherein the wing portion is swung by weight itself.

15. The flexible circuit board shielding device for the electronic apparatus as claimed in claim 2, wherein a flexible circuit board or cable is disposed between the slide and/or rotation module and the fixed machine body.

16. The flexible circuit board shielding device for the electronic apparatus as claimed in claim 1, wherein the body is a plate that is defined with a narrow side and a wide side.

17. The flexible circuit board shielding device for the electronic apparatus as claimed in claim 16, wherein in the body the pivot portion is formed on the narrow side and the free end is formed on the wide side.

18. The flexible circuit board shielding device for the electronic apparatus as claimed in claim 16, wherein a flexible circuit board or cable is disposed between the slide and/or rotation module and the fixed machine body.

19. The flexible circuit board shielding device for the electronic apparatus as claimed in claim 1, wherein the slide and/or rotation module comprises a rotary shaft portion, and the pivot portion of the body is assembled to the rotary shaft portion of the slide and/or rotation module, so that the body is formed by type of being freely rotated.

20. The flexible circuit board shielding device for the electronic apparatus as claimed in claim 19, wherein a flexible circuit board or cable is disposed between the slide and/or rotation module and the fixed machine body.

21. The flexible circuit board shielding device for the electronic apparatus as claimed in claim 1, wherein the rail is formed on both sides of the recessed compartment of the fixed machine body.

22. The flexible circuit board shielding device for the electronic apparatus as claimed in claim 21, wherein the body further comprises at least one peg formed on the free end and movably and rotatably assembled in the rail of the fixed machine body.

23. The flexible circuit board shielding device for the electronic apparatus as claimed in claim 1, wherein the body further comprises at least one peg formed on the free end and movably and rotatably assembled in the rail of the fixed machine body.

24. The flexible circuit board shielding device for the electronic apparatus as claimed in claim 1, wherein a flexible circuit board or cable is disposed between the slide and/or rotation module and the fixed machine body.

* * * * *